United States Patent
Kim et al.

(10) Patent No.: US 7,881,101 B2
(45) Date of Patent: Feb. 1, 2011

(54) NONVOLATILE MEMORY DEVICES THAT INCLUDE A WRITE CIRCUIT THAT WRITES DATA OVER MULTIPLE WRITE PERIODS USING PULSES WHOSE PEAKS DO NOT COINCIDE WITH EACH OTHER

(75) Inventors: Young-Ran Kim, Gyeonggi-do (KR); Ki-Won Lim, Gyeonggi-do (KR); Byung-Gil Choi, Gyeonggi-do (KR); Ki-Sung Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 204 days.

(21) Appl. No.: 12/179,321

(22) Filed: Jul. 24, 2008

(65) Prior Publication Data

US 2009/0034324 A1    Feb. 5, 2009

(30) Foreign Application Priority Data

Jul. 30, 2007    (KR) .................. 10-2007-0076510

(51) Int. Cl.
*G11C 11/00*    (2006.01)

(52) U.S. Cl. .............. 365/163; 365/189.02; 365/189.16

(58) Field of Classification Search ................. 365/163, 365/189.02, 189.16
See application file for complete search history.

(56) References Cited

U.S. PATENT DOCUMENTS

| | | | | |
|---|---|---|---|---|
| 5,784,316 | A * | 7/1998 | Hirata | .................... 365/185.22 |
| 6,201,738 | B1 * | 3/2001 | Hebishima | ............. 365/185.21 |
| 7,453,727 | B2 * | 11/2008 | Konishi | ................. 365/185.09 |

FOREIGN PATENT DOCUMENTS

| | | | |
|---|---|---|---|
| KR | 1020050118332 A | | 12/2005 |
| KR | 1020060004289 A | | 1/2006 |
| KR | 1020060105358 A | | 10/2006 |

* cited by examiner

*Primary Examiner*—Pho M Luu
(74) *Attorney, Agent, or Firm*—Myers Bigel Sibley & Sajovec, P.A.

(57) ABSTRACT

Nonvolatile memory devices include a plurality of nonvolatile memory cells and a write circuit that is operable to write data to the nonvolatile memory cells over a plurality of consecutive division write periods by generating a plurality of write pulses whose peaks do not coincide with one another to the nonvolatile memory cells.

20 Claims, 8 Drawing Sheets

NONVOLATILE MEMORY DEVICES THAT INCLUDE A WRITE CIRCUIT THAT WRITES DATA OVER MULTIPLE WRITE PERIODS USING PULSES WHOSE PEAKS DO NOT COINCIDE WITH EACH OTHER

CROSS REFERENCE TO RELATED APPLICATION

This application claims priority to Korean Patent Application No. 10-2007-0076510 filed on Jul. 30, 2007 in the Korean Intellectual Property Office, the disclosure of which is hereby incorporated herein by reference in its entirety.

FIELD OF THE INVENTION

The present invention relates generally to memory devices, and, more particularly, to nonvolatile memory devices that use a resistance material.

BACKGROUND OF THE INVENTION

Examples of nonvolatile memory devices that use a resistance material include Phase change Random Access Memory (PRAM) devices, Resistive Random Access Memory (RRAM) devices, and Magnetic Random Access Memory (MRAM) devices. These nonvolatile memory devices store data using variations in the state of a phase change material, such as a chalcogenide alloy, variations in the resistance of a variable resistor, or variations in the resistance of a magnetic tunnel junction (MTJ) thin film with respect to the magnetization of a ferromagnetic material, whereas Dynamic Random Access Memory (DRAM) devices or flash memory devices store data using charge.

In particular, PRAM devices define a crystalline phase of a phase change material as corresponding to set data or data [0] and define an amorphous phase of a phase change material as corresponding to reset data or data [1] in consideration that a phase change material has a relatively low resistance when in the crystalline phase and a relatively high resistance when in the amorphous state. In addition, in the case of PRAM devices, a write pulse, such as a set pulse or a reset pulse, is provided to a phase change material and data is written to the phase change material with Joule heat generated by the write pulse.

Specifically, PRAM devices apply a write pulse, such as a set pulse or a reset pulse, to phase change materials and write data to the phase change materials using Joule heat generated by the write pulse. One type of PRAM device writes data [1] to phase change materials by heating the phase change materials to their melting temperature or higher using a reset pulse and quickly cooling the phase change materials so that the phase change materials become amorphous. In contrast, another type of PRAM device writes data [0] to phase change materials by heating the phase change materials to a temperature between the crystallization temperature and the melting temperature of the phase change materials using a set pulse, and then maintaining the temperature of the phase change materials for a predefined amount of time so that the phase change materials become crystalline.

Conventional PRAM devices, however, may not be able to simultaneously write a plurality of input data (e.g., 16 bits) received through a plurality of input/output (I/O) pins (e.g., 16 I/O pins) to a plurality of PRAM cells. For example, if the current of a reset pulse provided to a single PRAM cell is 1 mA, a current of 16 mA is required to simultaneously write data to 16 PRAM cells. In this case, if the operating efficiency of a write driver is about 10%, a current of 160 mA is required to simultaneously write data to 16 PRAM cells. Because the current-driving capability of PRAM devices may be limited, the number of PRAM cells to which data can be simultaneously written may also be limited.

SUMMARY

According to some embodiments of the present invention, there is provided a nonvolatile memory device that includes a plurality of nonvolatile memory cells and a write circuit that is operable to write data to the nonvolatile memory cells over a plurality of consecutive write periods by generating a plurality of write pulses whose peaks do not coincide with one another.

In other embodiments of the present invention, there is provided a nonvolatile memory device that includes a plurality of wordlines and a plurality of bitlines; a plurality of nonvolatile memory cells, which are respectively coupled between the wordlines and the bitlines; and a write circuit which is coupled to the bitlines, and is operable to generate a plurality of set pulses whose peaks do not coincide with one another to the respective bitlines.

In still other embodiments of the present invention, there is provided a nonvolatile memory device that includes a plurality of nonvolatile memory cells and a write circuit that is operable to write data to the nonvolatile memory cells over a plurality of consecutive division write periods by generating a set pulse or a reset pulse in each of the write periods. A peak of a set pulse is closer to a beginning than to an end of a division write period and a peak of a reset pulse is closer to an end than to a beginning of a division write period.

According to still other embodiments of the present invention, there is provided a nonvolatile memory device that includes a plurality of nonvolatile memory cells; a write control circuit which generates a plurality of write control signals responsive to a plurality of data to be written to the nonvolatile memory cells, the plurality of write control signals having activation periods that vary according to the respective plurality of data; and a plurality of write drivers which are respectively provided with the write control signals, and generate a plurality of write pulses whose activation periods vary according to the respective write control signals.

BRIEF DESCRIPTION OF THE DRAWINGS

The above and other features and advantages of the present invention will become apparent by describing in detail embodiments thereof with reference to the attached drawings in which.

DETAILED DESCRIPTION OF EMBODIMENTS OF THE INVENTION

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

As used herein, the singular forms "a," "an," and "the" are intended to include the plural forms as well, unless expressly stated otherwise. It should be further understood that the terms "comprises" and/or "comprising" when used in this specification is taken to specify the presence of stated features, integers, steps, operations, elements, and/or components, but does not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

For purposes of illustration, embodiments of the present invention are described hereafter with reference to a phase change random access memory (PRAM). It will be understood, however, that the present invention is not limited to PRAM embodiments, but may include, but is not limited to, other nonvolatile memory devices that use a resistive element, such as resistive RAM (RRAM) and ferroelectric RAM (FRAM).

Figure 1:
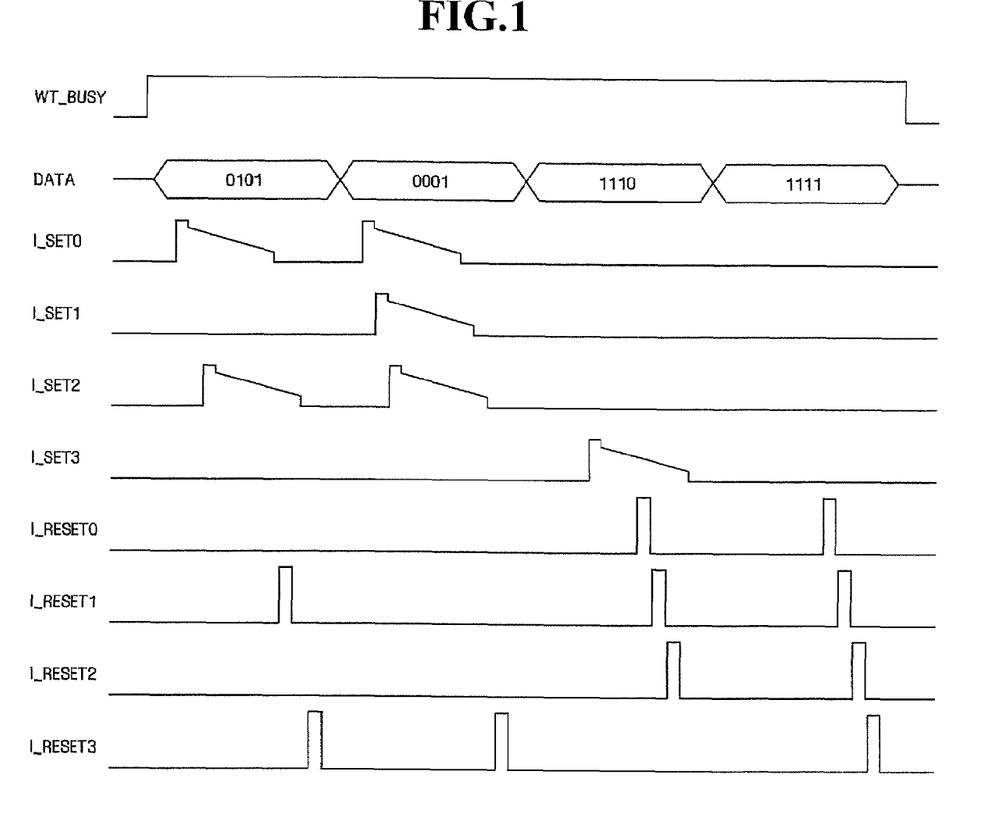
FIG. 1 is a timing diagram that illustrates operations of a nonvolatile memory device according to some embodiments of the present invention.
Figure 2:
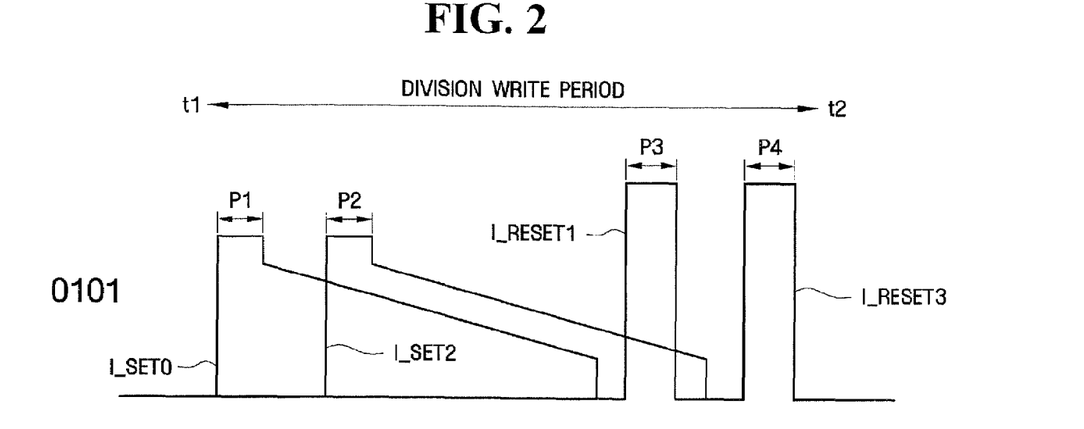
FIG. 2 illustrates a write pulse used to write data "0101" to a first cell group during a first division write period according to some embodiments of the present invention.
Figure 3:
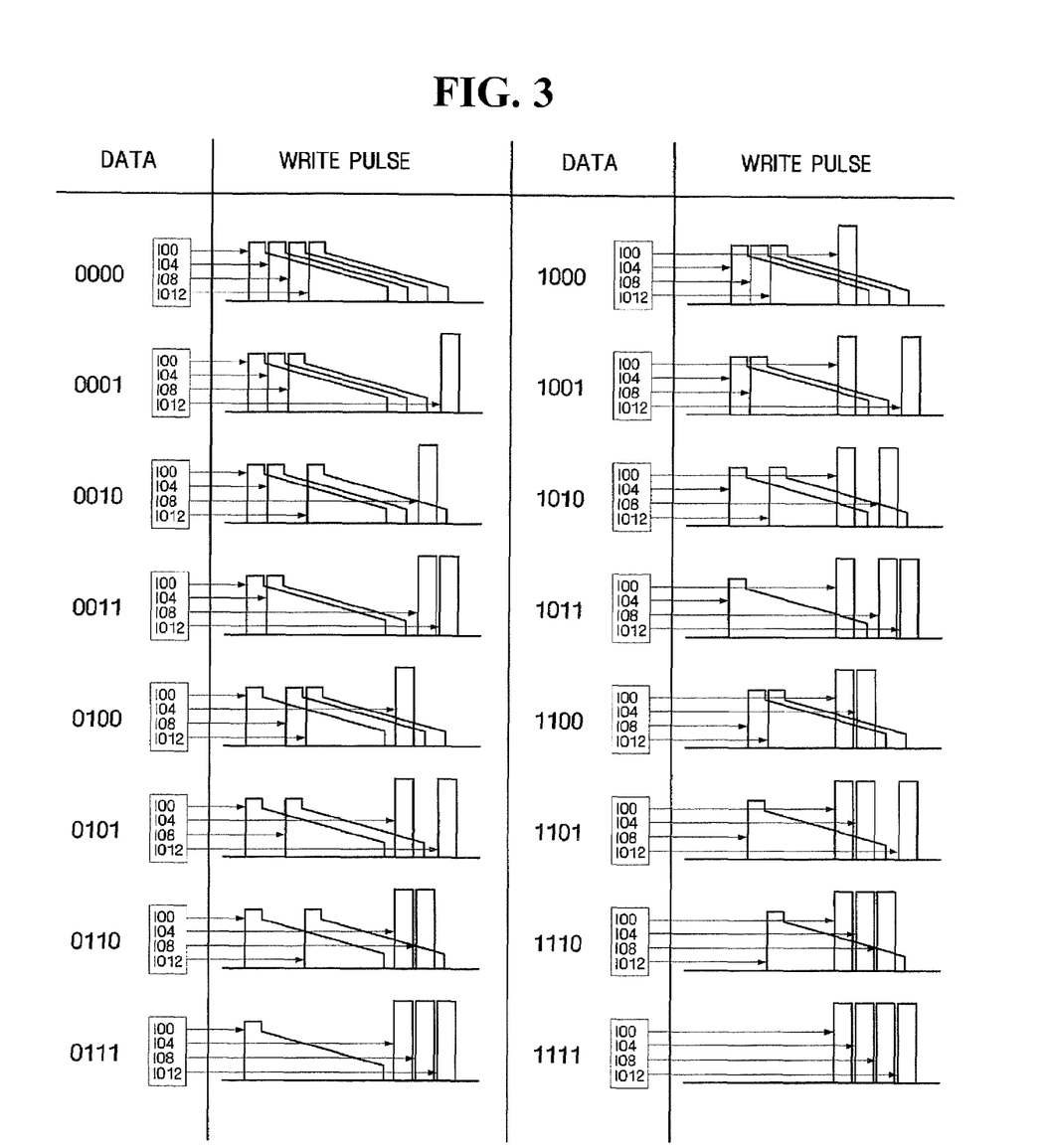
FIG. 3 is a pulse diagram that illustrates operations of a nonvolatile memory device according to some embodiments of the present invention.

FIG. 1 is a timing diagram that illustrates operations of a nonvolatile memory device according to some embodiments of the present invention, FIG. 2 illustrates a write pulse that is used to write data [0101] to a first cell group during a first division write period, FIG. 3 is a collection of pulse diagrams that illustrate operations of a nonvolatile memory device according to some embodiments of the present invention, and FIGS. 4A through 4D illustrate set pulses that can be used in a nonvolatile memory device according to some embodiments of the present invention.

A nonvolatile memory device, according to some embodiments of the present invention, may perform a division write operation. It will be understood, however, that embodiments of the present invention are not limited to such functionality. For purposes of illustration, a write operation of a nonvolatile memory device will be described in detail below, taking as an example writing input data received through 16 input/output (I/O) pins to 16 Phase change Random Access Memory (PRAM) cells.

The 16 PRAM cells may be divided into four cell groups, as indicated by Table 1 below.

TABLE 1

| an example of cell groups | | | |
|---|---|---|---|
| Cell Groups | | | |
| 1 | 2 | 3 | 4 |
| I/O Pins {0, 4, 8, 12} | {1, 5, 9, 13} | {2, 6, 10, 14} | {3, 7, 11, 15} |

Referring to Table 1, a plurality of PRAM cells to which input data received through the zeroth, fourth, eighth and twelfth I/O pins IO0, IO4, IO8 and IO12 is to be respectively written may be classified into a first cell group.

A division write operation may be performed in units of the four cell groups. According to the embodiment of FIGS. 1 through 4D, data (particularly, 4-bit data) may be simultaneously written to four PRAM cells included in a cell group as indicated by Table 1. Embodiments of the present invention are not restricted to writing 4-bit data. In other embodiments, for example, 2-bit data, 8-bit data, or 16-bit data may be simultaneously written to four PRAM cells included in a cell group.

Specifically, data may be written to a plurality of nonvolatile memory cells, which are divided into one or more cell groups, over a plurality of consecutive division write periods. Referring to FIG. 1, data [0101] is written to a first cell group during a first division write period, data [0001] is written to a second cell group during a second division write period, data [1110] is written to a third cell group during a third division write period, and data [1111] is written to a fourth cell group during a fourth division write period.

Nonvolatile memory devices according to the embodiment of FIGS. 1 through 4D may write data to a plurality of nonvolatile memory cells by providing a plurality of write pulses during a division write period. Examples of the write pulses include a plurality of set pulses I_SET0 through I_SET3 for writing set data to the nonvolatile memory cells, and a plurality of reset pulses I_RESET0 through I_RESET3 for writing reset data to the nonvolatile memory cells.

The set pulses I_SET0 through I_SET3 are used to crystallize a phase change material of a PRAM cell by heating the phase change material to a temperature between the crystallization temperature and the melting temperature of the phase change material, maintaining the temperature of the phase change material for a predefined amount of time, and cooling the phase change material. The reset pulses I_RESET0 through I_RESET3 are used to make a phase change material of a PRAM cell become amorphous by heating the phase change material to a temperature higher than the melting temperature of the phase change material and quickly cooling the phase change material. In general, the peak level of the set pulses I_SET0 through I_SET3 is lower than the peak level of the reset pulses I_RESET0 through I_RESET3, and the width of the set pulses I_SET0 through I_SET3 is greater than the width of the reset pulses I_RESET0 through I_RESET3. The peak of the set pulses I_SET0 through I_SET3 or the reset pulses I_RESET0 through I_RESET3 indicates a maximum current level of the set pulses I_SET0 through I_SET3 or the reset pulses I_RESET0 through I_RESET3.

Figure 4A:
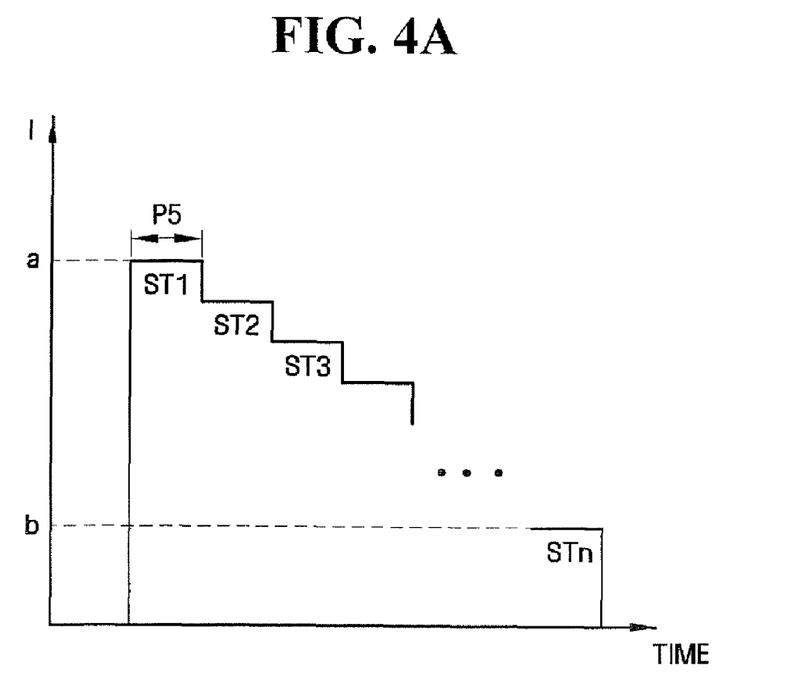
FIGS. 4A through 4D illustrate a plurality of set pulses that can be used in a nonvolatile memory device according to some embodiments of the present invention.
Figure 4B:
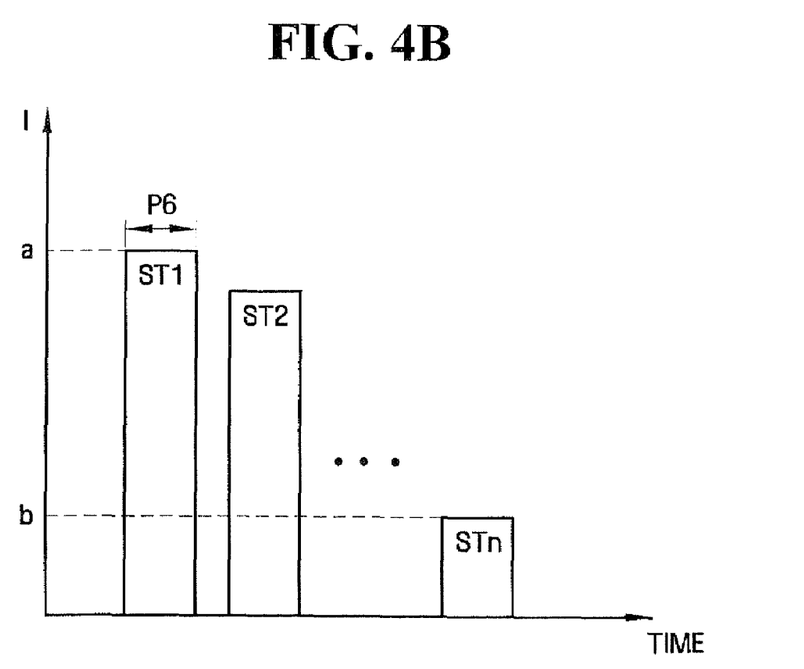
Figure 4C:
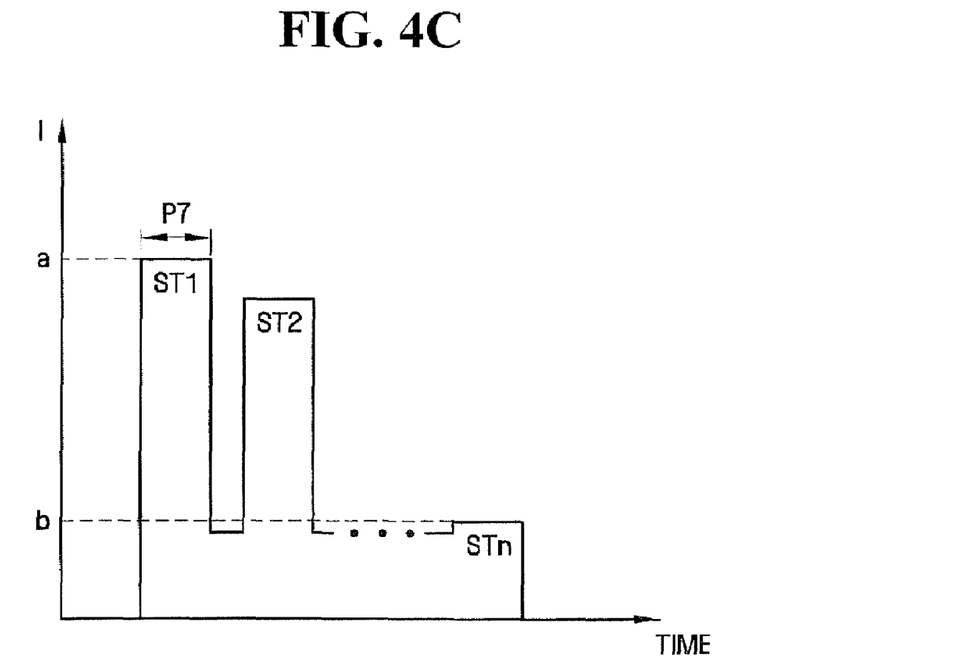

Referring to FIGS. 1 and 2, each of the set pulses I_SET0 through I_SET3 may be a current pulse whose peak P1 or P2 is maintained for a predefined amount of time and whose level decreases from the peak P1 or P2 with a predetermined slope. It will be understood, however, that embodiments of the present invention are not limited to a specific type of pulse waveform. In other embodiments, each of the set pulses I_SET0 through I_SET3 may include a plurality of stages ST1 through STn, and may thus incrementally decrease from a first current a to a second current b in the stages ST1 through STn as illustrated in FIG. 4A. Alternatively, each of the set pulses I_SET0 through I_SET3 may include the stages ST1 through STn and a plurality of non-stage sections, which are disposed among the stages ST1 through STn, and have a predefined current and incrementally decrease from the first current a to the second current b in the stages ST1 through STn, as illustrated in FIGS. 4B and 4C. The non-stage sections of each of the set pulses I_SET0 through I_SET3 may have a current of 0 A, as illustrated in FIG. 4B, or may have a current higher than 0 A, as illustrated in FIG. 4C. Referring to FIGS. 4A through 4C, peaks P5, P6, and P7 all correspond to the first stage ST1. In other embodiments, each of the set pulses I_SET0 through I_SET3 may be a current pulse, which continually decreases from the first current a to the second current with a predetermined slope.

Figure 4D:
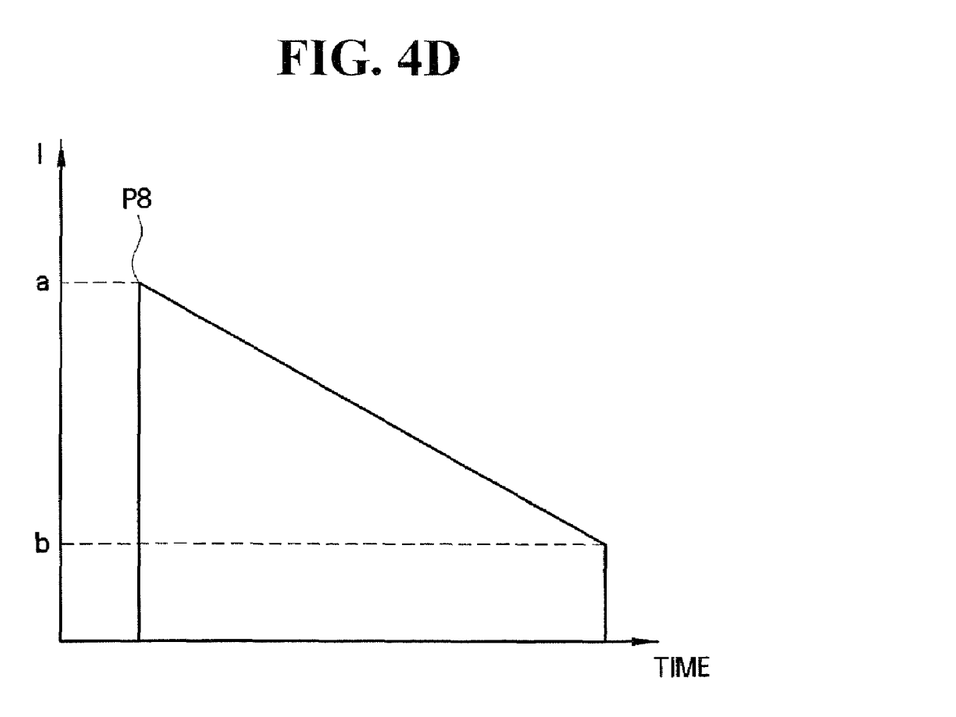

The peak of a write pulse may indicate a period of time, as illustrated in FIGS. 4A through 4C, or may indicate a moment of time, as illustrated in FIG. 4D.

Referring to FIG. 2, nonvolatile memory devices of the embodiment of FIGS. 1 through 4D may adjust the activation periods of a plurality of write pulses I_SET0, I_SET2, I_RESET1 and I_RESET3, which are provided during a division write period between a time t1 and a time t2, so that peaks P1, P2, P3, and P4 of the write pulses I_SET0, I_SET2, I_RESET1 and I_RESET3 may not coincide with one another. Referring to FIG. 2, the write pulses I_SET0, I_SET2, I_RESET1 and I_RESET3 are laid overlapping one another.

Specifically, the peaks P1 and P2 of the set pulses I_SET0 and I_SET2 may not coincide with the peaks P3 and P4 of the reset pulses I_RESET1 and I_RESET3. Also, the peaks P1 and P2 of the set pulses I_SET0 and ISET2 may not coincide with each other. Also, the peaks P3 and P3 of the reset pulses I_RESET1 and I_RESET 3 may not coincide with each other.

When the peaks P1, P2, P3 and P4 of the write pulses I_SET0, I_SET2, I_RESET1 and I_RESET3, which are provided during the division write period between the time t1 and the time t2, do not coincide with one another, a peak current required for a write operation can be reduced or minimized. Therefore, the number of PRAM cells to which data can be simultaneously written during the division write period between the time t1 and the time t2 can be increased regardless of the current driving capability of a PRAM device.

The peaks P1 and P2 of the set pulses I_SET0 and I_SET2, which are provided during the division write period between the time t1 and the time t2, are closer to the beginning than to the end of the corresponding division write period. That is, the peaks P1 and P2 of the set pulses I_SET0 and I_SET2 are closer to the time t1 than to the time t2. In contrast, the peaks P3 and P4 of the reset pulses I_RESET1 and I_RESET3, which are also provided during the division write period between the time t1 and the time t2, are closer to the time t2 than to the time t1.

As described above, the width of the set pulses I_SET0 and I_SET2 is greater than the width of the reset pulses I_RESET1 and I_RESET3. Thus, only if the peaks P1 and P2 of the set pulses I_SET0 and I_SET2 are closer to the beginning than to the end of the division write period between the time t1 and the time t2 is it possible to reduce the time taken to perform a write operation. If the set pulses I_SET0 and I_SET2 are current pulses whose current amounts decrease over time as illustrated in FIGS. 2 and 4A through 4D, and the peaks P3 and P4 of the reset pulses I_RESET1 and I_RESET3 are closer to the beginning than to the end of the division write period between the time t1 and the time t2, fluctuations in the current consumption of a nonvolatile memory device during the division write period between the time t1 and the time t2 may be reduced, and, thus, the efficiency and stability of a write operation may be increased.

Nonvolatile memory devices of the embodiments of FIGS. 1 through 4D may use a plurality of write pulses, such as those illustrated in FIG. 3. Referring to FIG. 3, a plurality of write pulses required to write a plurality of data [0000] through [1111] to a first cell group are laid overlapping one another.

According to the embodiments of FIGS. 1 through 4D, the peaks of a plurality of write pulses required to write each of the plurality of data [0000] through [1111] may not coincide with one another.

Also, according to the embodiments of FIGS. 1 through 4D, the activation periods of a plurality of write pulses required to write each of the plurality of data [0000] through [1111] may be adjusted so as not to coincide with one another. For example, three set pulses and one reset pulse are used to write data [0001], [0010], [0100], or [1000]. To write data [0001], three set pulses may be sequentially activated at the beginning of a division write period, and a reset pulse may be activated near the end of the division write period. In contrast, to write data [0010], two set pulses may be sequentially activated first at the beginning of a division write period, another set pulse may be activated a predetermined time after the sequential activation of the two set pulses, and a reset pulse may be activated near the end of the division write period. To write data [0100], a set pulse may be activated first, two other set pulses may be sequentially activated a predetermined time after the activation of the first set pulse, and a reset pulse may be activated near the end of a division write period. To write data [1000], three set pulses may be sequentially activated a predetermined time after the beginning of a division write period, and then a reset pulse may be activated. As a result, the activation periods of three set pulses and a reset pulse used to write data [0001], [0010], [0100], or [1000] may not coincide with one another.

Figure 5:
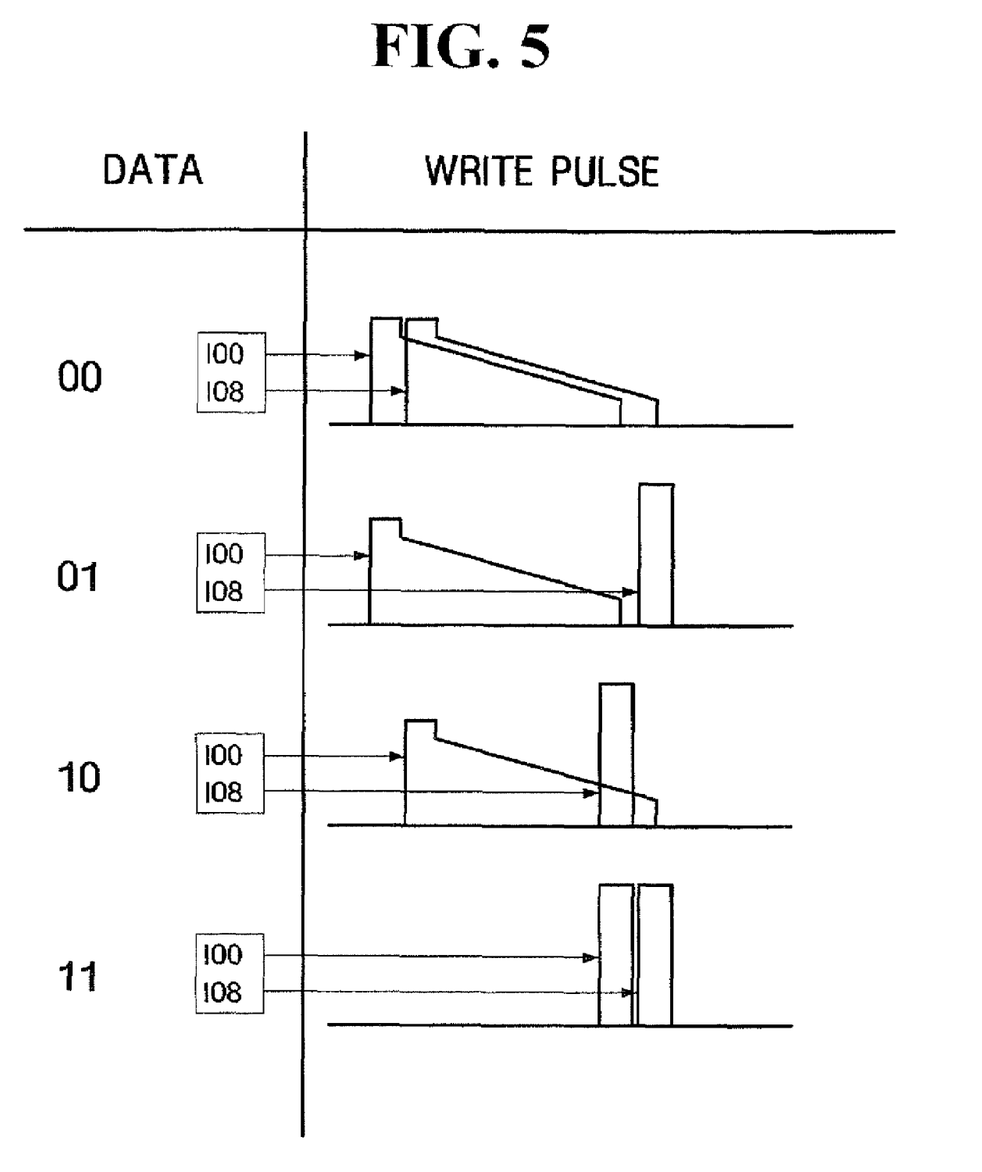
FIG. 5 is a pulse diagram that illustrates operations of a nonvolatile memory device according to further embodiments of the present invention.

FIG. 5 illustrates operations of a nonvolatile memory device according to further embodiments of the present invention. Nonvolatile memory devices according to the embodiments of FIG. 5 may write 2-bit data at one time. Embodiments of FIG. 5 are described in detail below by way of example in which input data received through 16 I/O pins is written to 16 PRAM cells. The 16 PRAM cells may be divided into 8 cell groups as indicated by Table 2 below.

TABLE 2

| another example of cell groups |
| --- |

| | Cell Groups | | | | | | | |
| --- | --- | --- | --- | --- | --- | --- | --- | --- |
| | 1 | 2 | 3 | 4 | 5 | 6 | 7 | 8 |
| I/O Pins | {0, 8} | {1, 9} | {2, 10} | {3, 11} | {4, 12} | {5, 13} | {6, 14} | {7, 15} |

Referring to Table 2, a plurality of PRAM cells to which input data received through the zeroth and eighth I/O pins IO0 and IO8 is to be written may be classified into a first cell group. A nonvolatile memory device according to the embodiments of FIG. 5, like a nonvolatile memory device according to the embodiments of FIGS. 1 through 4D, writes data to a plurality of cell groups over a plurality of consecutive division write periods.

Specifically, FIG. 5 illustrates a plurality of write pulses that are used to write data [00], [01], [10], or [11] to a first cell group. Referring to FIG. 5, the activation periods of a plurality of write pulses used to write data [00], [01], [10], or [11] to a first cell group may not coincide with one another. For example, one set pulse and one reset pulse may be used to write data [01] or [10]. To write data [01], a set pulse may be activated at the beginning of a division write period, and a reset pulse may be activated at the end of the division write period. In contrast, to write data [10], a set pulse and a reset pulse may be activated in the middle of the division write period.

Figure 6:
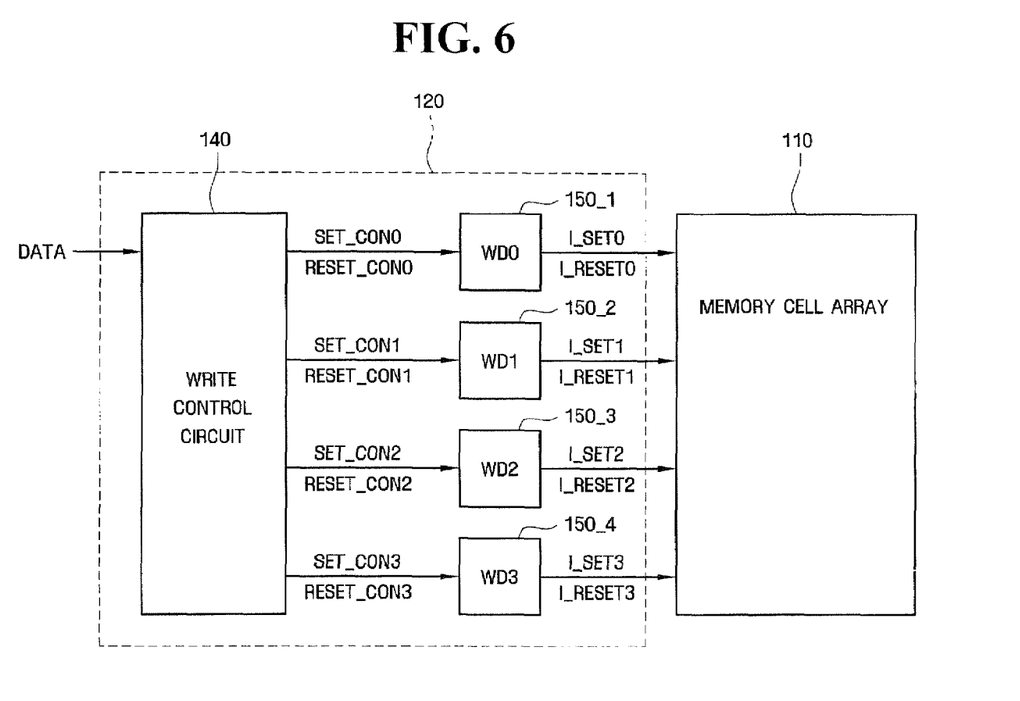
FIG. 6 is a block diagram of a nonvolatile memory device according to some embodiments of the present invention.
Figure 7:
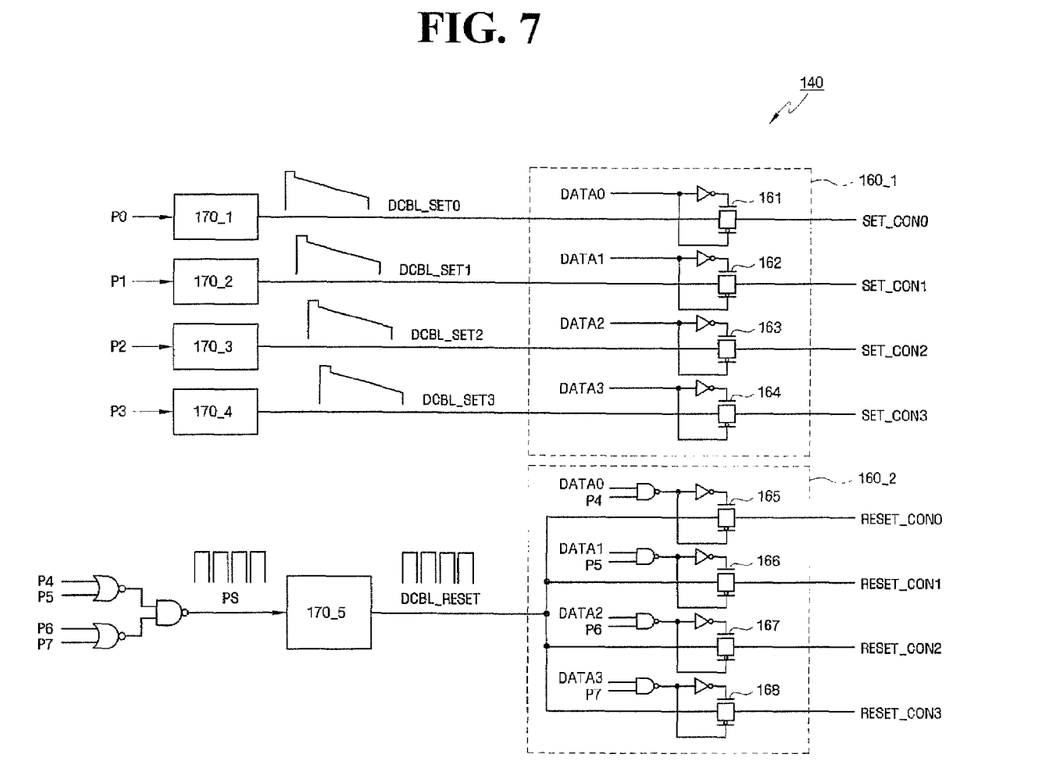
FIG. 7 is a block diagram of the write control circuit of FIG. 6 according to some embodiments of the present invention.

FIG. 6 illustrates a block diagram of a nonvolatile memory device according to some embodiments of the present invention FIG. 7 illustrates a detailed block diagram of the write control circuit 140 illustrated in FIG. 6.

Referring to FIG. 6, the nonvolatile memory device includes a memory cell array 110 and a write circuit 120. The memory cell array 110 includes a plurality of PRAM cells, which can be divided into one or more cell groups. A PRAM cell includes a variable resistance element, which has a phase change material whose resistance varies according to whether the PRAM cell is in a crystalline state or an amorphous state; and an access element, which controls a current that flows in the variable resistance element. An access element of a PRAM cell may be a diode or a transistor, which is connected in series to a variable resistance element of the PRAM cell. The phase change material of a variable resistance element of a PRAM cell may include a compound of two elements, such as GaSb, InSb, InSe. $Sb_2Te_3$, and/or GeTe, a compound of three elements, such as GeSbTe, GaSeTe, InSbTe, $SnSb_2Te_4$, and/or InSbGe, or a compound of four elements, such as AgInSbTe, (GeSn)SbTe, GeSb(SeTe), and/or $Te_{81}Ge_{15}Sb_2S_2$. In some embodiments, the phase change material of a variable resistance element of a PRAM cell may include a compound of Ge, Sb, and Te, i.e., GeSbTe.

The write circuit 120 may provide a plurality of set pulses I_SET0 through I_SET3 and a plurality of reset pulses I_RESET0 through I_RESET3 to a plurality of nonvolatile memory cells whose peaks do not coincide with one another over a plurality of consecutive division write periods, and adjusts the peaks of the set pulses I_SET0 through I_SET3 and/or the reset pulses I_RESET0 through I_RESET3 not to coincide with one another. That is, the peaks of the set pulses I_SET0 through I_SET3 may not coincide with the peaks of the reset pulses I_RESET0 through I_RESET3, the peaks of the set pulses I_SET0 through I_SET3 may not coincide with one another, or the peaks of the reset pulses I_RESET0 through I_RESET3 may not coincide with one another. The peaks of the set pulses I_SET0 through I_SET3 may be closer to a beginning than an end of a division write period. In contrast, the peaks of the reset pulses I_RESET0 through I_RESET3 may be closer to an end than to a beginning of a division write period.

The write circuit 120 includes a write control circuit 140 and a plurality of write drivers 150_1 through 150_4.

The write control circuit 140 provides a plurality of set control signals SET_CON0 through SET_CON3 or a plurality of reset control signals RESET_CON0 through RESET_CON3 responsive to a plurality of data DATA, which are to be written to a plurality of nonvolatile memory cells. The activation periods of the set control signals SET_CON0 through SET_CON3 and the reset control signals RESET_CON0 through RESET_CON3 may vary according to the respective plurality of data DATA.

The write drivers 150_1 through 150_4 respectively provide the set pulses I_SET0 through I_SET3 or the reset pulses I_RESET0 through I_RESET3 responsive to the set control signals SET_CON0 through SET_CON3 or the reset control signals RESET_CON0 through RESET_CON3. The activation periods of the set pulses I_SET0 through I_SET3 may vary according to the respective set control signals SET_CON0 through SET_CON3, and the activation periods of the reset pulses I_RESET0 through I_RESET3 may vary according to the respective reset control signals RESET_CON0 through RESET_CON3.

Referring to FIG. 7, the write control circuit 140 may include a plurality of pre-set control signal providers 170_1 through 170_4, a first multiplexer 160_1, a pre-reset control signal provider 170_5, and a second multiplexer 160_2.

The pre-set control signal providers 170_1 through 170_4 respectively provide a plurality of pre-set control signals DCBL_SET0 through DCBL_SET3 responsive to a plurality of first control pulses P0 through P3. The pre-set control signal providers 170_1 through 170_4 may adjust the peaks of the pre-set control signals DCBL_SET0 through DCBL_SET3 so as not to coincide with one another. The waveforms of the pre-set control signals DCBL_SET0 through DCBL_SET3 may be the same as or similar to the waveforms of the set control signals I_SET0 through I_SET3 of FIGS. 2 through 4A. That is, each of the pre-set control signals DCBL_SET0 through DCBL_SET3 may be a voltage pulse whose peak is maintained for a predetermined period of time and whose level decreases from the peak with a predetermined slope as illustrated in FIG. 2. In other embodiments, each of the pre-set control signals DCBL_SET0 through DCBL_SET3 may be a voltage pulse whose level incrementally decreases from a first voltage to a second voltage in a plurality of stages as illustrated in FIGS. 4A through 4C. In still other embodiments, each of the pre-set control signals DCBL_SET0 through DCBL_SET3 may be a voltage pulse whose level continually decreases from the first voltage to the second voltage with a predetermined slope.

The first multiplexer 160_1 includes a plurality of transmission gates 161 through 164. The transmission gates 161 through 164 are responsive to the pre-set control signals DCBL_SET0 through DCBL_SET3, respectively, and a plurality of data DATA0 through DATA3, respectively. Then, the transmission gates 161 through 164 selectively output the pre-set control signals DCBL_SET0 through DCBL_SET3 as the set control signals SET_CON0 through SET_CON3 according to the plurality of data DATA0 through DATA3.

The pre-reset control signal provider 170_5 provides a pre-reset control signal DCBL_RESET responsive to a pulse PS, which is obtained by combining a plurality of second control pulses P4 through P7. In other embodiments, a plurality of pre-reset control signal providers may be provided. In this case, the pre-reset control signal providers may respectively provide a plurality of pre-reset control signals responsive to the second control pulses P4 through P7, and may adjust the peaks of the pre-reset controls signals so as not to coincide with one another. According to the embodiments of FIGS. 6 and 7, the pre-reset control signal DCBL_RESET may be provided using the pulse PS instead of using the individual second control pulses P4 through P4, thereby reducing the number of pre-reset control signal providers.

The second multiplexer 160_2 includes a plurality of transmission gates 165 through 168. The transmission gates 165 through 168 are respectively responsive to the second control pulses P4 through P7, and output the reset control signals RESET_CON0 through RESET_CON3 according to the plurality of data DATA0 through DATA3 and the second control pulses P4 through P7.

Embodiments of the present invention are described hereafter by way of example with reference to FIGS. 6 and 7 in which data [0101] is written to four nonvolatile memory cells.

The transmission gates 161 and 163 of the first multiplexer 160_1 are respectively provided with the data DATA0 and the data DATA2 and output the pre-set control signals DCBL_SET0 and DCBL_SET2 as the set control signals SET_CON0 and SET_CON2, whereas the transmission gates 162 and 164 of the first multiplexer 160_1 do not operate.

The transmission gates 166 and 168 of the second multiplexer 160_2, which are respectively provided with the data DATA1 and the data DATA3, are turned on and provide the reset control signals RESET_CON1 and RESET_CON3, whereas the transmission gates 165 and 167 of the second multiplexer 160_2 do not operate.

The write driver 150_1 is provided with the set control signal SET_CON0, and, thus, provides the set pulse I_SET0; the write driver 150_2 is provided with the reset control signal RESET_CON1, and, thus, provides the reset pulse I_RESET1; the write driver 150_3 is provided with the set control signal SET_CON2, and, thus, provides the set pulse I_SET2; and the write driver 150_4 is provided with the reset control signal RESET_CON3, and, thus, provides the reset pulse I_RESET3.

According to some embodiments of the present invention, the peaks of a plurality of write pulses do not coincide with one another. Thus, it may be possible to reduce or minimize a peak current required to perform a write operation. Therefore, it may be possible to increase the number of nonvolatile memory cells to which data can be simultaneously written.

Moreover, according to some embodiments of the present invention, the peak of a set pulse is closer to a beginning than to an end of a division write period, thereby reducing the time taken to perform a write operation. In addition, according to some embodiments of the present invention, the peak of a set pulse is closer to an end than to a beginning of a division write period, thereby reducing fluctuations in the current consumption of a nonvolatile memory device during the division write period and eventually improving the efficiency and stability of a write operation.

While the present invention has been particularly shown and described with reference to exemplary embodiments thereof, it will be understood by those of ordinary skill in the art that various changes in form and details may be made therein without departing from the spirit and scope of the present invention as defined by the following claims.

That which is claimed:

1. A nonvolatile memory device, comprising:
   a plurality of nonvolatile memory cells; and
   a write circuit that is operable to write data to the nonvolatile memory cells over a plurality of consecutive division write periods by generating a plurality of write pulses whose peaks do not coincide with one another;
   wherein the write pulses comprise at least one set pulse for writing set data to the nonvolatile memory cells and at least one reset pulse for writing reset data to the nonvolatile memory cells.

2. The nonvolatile memory device of claim 1, wherein peaks of a set pulse and a reset pulse that are generated during a same division write period do not coincide with each other.

3. The nonvolatile memory device of claim 1, wherein peaks of a plurality of set pulses that are generated during a same division write period do not coincide with one another.

4. The nonvolatile memory device of claim 1, wherein peaks of a plurality of reset pulses that are generated during a same division write period do not coincide with one another.

5. The nonvolatile memory device of claim 1, wherein a peak of one of the at least one set pulse is closer to a beginning than to an end of a division write period.

6. The nonvolatile memory device of claim 1, wherein a peak of one of the at least one reset pulse is closer to an end than to a beginning of a division write period.

7. The nonvolatile memory device of claim 1, wherein a peak level of one of the at least one set pulse is lower than a peak level of one of the at least one reset pulse, and a width of the one of the at least one set pulse is greater than a width of the one of the at least one reset pulse.

8. The nonvolatile memory device of claim 1, wherein the write circuit comprises:
   a write control circuit that is configured to generate a plurality of write control signals responsive to the data, the plurality of write control signals having activation periods that vary according to respective ones of the data; and
   a plurality of write drivers that are configured to generate a plurality of write pulses responsive to the plurality of write control signals, the plurality of write pulses having activation periods that vary according to the respective ones of the plurality of write control signals.

9. The nonvolatile memory device of claim 8, wherein the write control circuit comprises:
   a pre-write control signal provider that is configured to generate a plurality of pre-write control signals whose peaks do not coincide with one another responsive to a control pulse; and
   a multiplexer that is configured to output the write control signals responsive to the pre-write control signals and the plurality of data.

10. The nonvolatile memory device of claim 1, wherein the nonvolatile memory cells are Phase change Random Access Memory (PRAM) cells.

11. A nonvolatile memory device, comprising:
a plurality of wordlines and a plurality of bitlines;
a plurality of nonvolatile memory cells, which are respectively coupled between the wordlines and the bitlines; and
a write circuit, which is coupled to the bitlines, and is operable to generate a plurality of set pulses whose peaks do not coincide with one another to the respective bitlines;
wherein the write circuit is operable to generate a plurality of reset pulses, whose peaks do not coincide with one another, to the respective bitlines.

12. A nonvolatile memory device, comprising:
a plurality of nonvolatile memory cells; and
a write circuit, which is operable to write data to the nonvolatile memory cells over a plurality of consecutive division write periods by generating a set pulse or a reset pulse in each of the write periods;
wherein a peak of each of the set pulses is closer to a write period beginning than to a write period end and a peak of each of the reset pulses is closer to the write period end than to the write period beginning.

13. The nonvolatile memory device of claim 12, wherein peaks of a plurality of set pulses that are generated during a same division write period do not coincide with one another.

14. The nonvolatile memory device of claim 12, wherein peaks of a plurality of reset pulses that are generated during a same division write period do not coincide with one another.

15. The nonvolatile memory device of claim 12, wherein a peak level of the set pulse is lower than a peak level of the reset pulse and a width of the set pulse is greater than a width of the reset pulse.

16. A nonvolatile memory device, comprising:
a plurality of nonvolatile memory cells;
a write control circuit that is configured to generate a plurality of write control signals responsive to a plurality of data to be written to the nonvolatile memory cells, the plurality of write control signals having activation periods that vary according to the respective ones of the plurality of data; and
a plurality of write drivers that are configured to generate a plurality of write pulses responsive to the plurality of write control signals, the plurality of write pulses having activation periods that vary according to the respective ones of the plurality of write control signals.

17. The nonvolatile memory device of claim 16, wherein the write control circuit comprises:
a pre-write control signal provider that is configured to generate a plurality of pre-write control signals whose peaks do not coincide with one another responsive to a control pulse; and
a multiplexer that is configured to output the write control signals responsive to the pre-write control signals and the plurality of data.

18. The nonvolatile memory device of claim 17, wherein the write control circuit further comprises:
a pre-set control signal provider that is configured to generate a plurality of pre-set control signals whose peaks do not coincide with one another responsive to a first control pulse; and
a first multiplexer that is configured to selectively output the pre-set control signals as the set control signals responsive to the plurality of data.

19. The nonvolatile memory device of claim 18, wherein the write control circuit further comprises:
a pre-reset control signal provider that is configured to generate a pre-reset control signal responsive to a predetermined pulse, the predetermined pulse being obtained by combining a plurality of second control pulses; and
a second multiplexer that is configured to selectively output the reset control signals responsive to the respective plurality of data and the pre-reset control signal.

20. The nonvolatile memory device of claim 16, wherein:
the write pulses comprise at least one set pulse for writing set data to the nonvolatile memory cells and at least one reset pulse for writing reset data to the nonvolatile memory cells; and
the write control signals comprise at least one set control signal for generating the at least one set pulse, and at least one reset control signal for generating the at least one reset pulse.

* * * * *